United States Patent
Chow et al.

(10) Patent No.: US 7,443,269 B2
(45) Date of Patent: Oct. 28, 2008

(54) METHOD AND APPARATUS FOR SELECTIVELY BLOCKING RADIO FREQUENCY (RF) SIGNALS IN A RADIO FREQUENCY (RF) SWITCHING CIRCUIT

(75) Inventors: Yut Hoong Chow, Penang (MY); Richard C Ruby, Menlo Park, CA (US); Chong Hin Chee, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 344 days.

(21) Appl. No.: 11/190,611

(22) Filed: Jul. 27, 2005

(65) Prior Publication Data

US 2007/0026836 A1    Feb. 1, 2007

(51) Int. Cl.
*H04B 1/10* (2006.01)
*H04B 1/16* (2006.01)

(52) U.S. Cl. .................. 333/186; 455/307; 455/339; 333/193

(58) Field of Classification Search ......... 455/286–290, 455/307, 333, 338–340; 331/107 R–107 T; 333/186–201
See application file for complete search history.

(56) References Cited

U.S. PATENT DOCUMENTS

| | | | |
|---|---|---|---|
| 3,174,122 A | 3/1965 | Fowler et al. | |
| 3,189,851 A | 6/1965 | Fowler | |
| 3,321,648 A | 5/1967 | Kolm | |
| 3,422,371 A | 1/1969 | Poirier et al. | |
| 3,568,108 A | 3/1971 | Poirier et al. | |
| 3,610,969 A | 10/1971 | Clawson et al. | |
| 4,456,850 A | 6/1984 | Inoue et al. | |
| 4,719,383 A | 1/1988 | Wang et al. | |
| 5,048,036 A | 9/1991 | Scifres et al. | |
| 5,294,898 A | 3/1994 | Dworsky et al. | |
| 5,587,620 A | 12/1996 | Ruby | |
| 5,671,242 A | 9/1997 | Takiguchi et al. | |
| 5,864,261 A | 1/1999 | Weber | |

(Continued)

FOREIGN PATENT DOCUMENTS

DE    10160617    5/2003

(Continued)

OTHER PUBLICATIONS

B. Hadimioglu et al., "Polymer Films As Acoustic Matching Layers", 1990 IEEE Ultrasonics Sysmposium Proceedings, vol. 3 pp. 1337-1340, Dec. 1990.

(Continued)

*Primary Examiner*—Simon D Nguyen

(57) ABSTRACT

An RF switching circuit that incorporates a film bulk acoustic resonator (FBAR) device and one or more capacitors that are used to vary the capacitance of the FBAR device to change the frequency range that is blocked by the FBAR device. When the RF switching circuit is in a first switching state, a first set of RF signals in a first frequency range is blocked by the RF switching circuit while RF signals of other frequencies are passed by the RF switching circuit. When the RF switching circuit is in a second switching state, a second set of RF signals in a second frequency range is blocked by the RF switching circuit while RF signals of other frequencies are passed by the RF switching circuit.

13 Claims, 4 Drawing Sheets

U.S. PATENT DOCUMENTS

| | | | |
|---|---|---|---|
| 5,872,493 | A | 2/1999 | Ella |
| 5,873,154 | A | 2/1999 | Ylilammi et al. |
| 5,910,756 | A | 6/1999 | Ella |
| 5,936,150 | A | 8/1999 | Korbin et al. |
| 5,953,479 | A | 9/1999 | Zhou et al. |
| 6,040,962 | A | 3/2000 | Kanazawa |
| 6,087,198 | A | 7/2000 | Panasik |
| 6,107,721 | A | 8/2000 | Lakin |
| 6,187,513 | B1 | 2/2001 | Katakura |
| 6,215,375 | B1 | 4/2001 | Larson et al. |
| 6,262,637 | B1 | 7/2001 | Bradley |
| 6,278,342 | B1 | 8/2001 | Ella |
| 6,292,336 | B1 | 9/2001 | Horng |
| 6,351,236 | B1 | 2/2002 | Hasler |
| 6,377,137 | B1 | 4/2002 | Ruby |
| 6,384,697 | B1 | 5/2002 | Ruby |
| 6,420,820 | B1 | 7/2002 | Larson, III |
| 6,424,237 | B1 | 7/2002 | Ruby et al. |
| 6,437,482 | B1 | 8/2002 | Shibata |
| 6,441,539 | B1 | 8/2002 | Kitamura et al. |
| 6,462,631 | B2 | 10/2002 | Bradley et al. |
| 6,466,105 | B1 | 10/2002 | Lobl et al. |
| 6,466,418 | B1 | 10/2002 | Horng |
| 6,469,597 | B2 | 10/2002 | Ruby et al. |
| 6,472,954 | B1 | 10/2002 | Ruby et al. |
| 6,483,229 | B2 | 11/2002 | Larson, III et al. |
| 6,489,862 | B1 | 12/2002 | Frank |
| 6,492,883 | B2 | 12/2002 | Liang et al. |
| 6,507,983 | B1 | 1/2003 | Ruby et al. |
| 6,522,201 | B1 * | 2/2003 | Hsiao et al. .................. 330/278 |
| 6,542,055 | B1 | 4/2003 | Frank et al. |
| 6,548,942 | B1 | 4/2003 | Panaski |
| 6,550,664 | B2 | 4/2003 | Bradley et al. |
| 6,566,979 | B2 | 5/2003 | Larson, III et al. |
| 6,583,688 | B2 | 6/2003 | Klee et al. |
| 6,600,390 | B2 | 7/2003 | Frank |
| 6,617,249 | B2 | 9/2003 | Ruby et al. |
| 6,651,488 | B2 | 11/2003 | Larson, III et al. |
| 6,668,618 | B2 | 12/2003 | Larson, III et al. |
| 6,670,866 | B2 | 12/2003 | Ella et al. |
| 6,710,508 | B2 | 3/2004 | Ruby et al. |
| 6,710,681 | B2 | 3/2004 | Figueredo et al. |
| 6,714,102 | B2 | 3/2004 | Ruby et al. |
| 6,720,844 | B1 | 4/2004 | Lakin |
| 6,777,267 | B2 | 8/2004 | Ruby et al. |
| 6,787,048 | B2 | 9/2004 | Bradley et al. |
| 6,794,958 | B2 | 9/2004 | Philliber et al. |
| 6,804,807 | B2 | 10/2004 | Jamneala et al. |
| 6,824,653 | B2 | 11/2004 | Oshmyansky et al. |
| 6,828,713 | B2 | 12/2004 | Bradley et al. |
| 6,838,956 | B2 | 1/2005 | Bradley |
| 6,873,529 | B2 | 3/2005 | Ikuta et al. |
| 6,874,211 | B2 | 4/2005 | Bradley et al. |
| 6,874,212 | B2 | 4/2005 | Larson, III |
| 6,879,224 | B2 | 4/2005 | Frank |
| 6,888,424 | B2 | 5/2005 | Takeuchi et al. |
| 6,894,360 | B2 | 5/2005 | Bradley |
| 6,900,705 | B2 | 5/2005 | Nakamura et al. |
| 6,906,451 | B2 | 6/2005 | Yamada et al. |
| 6,911,708 | B2 * | 6/2005 | Park .................. 257/416 |
| 6,917,261 | B2 | 7/2005 | Unterberger |
| 6,936,954 | B2 | 8/2005 | Peczalski |
| 6,946,928 | B2 | 9/2005 | Larson |
| 6,963,257 | B2 | 11/2005 | Ella et al. |
| 6,985,052 | B2 | 1/2006 | Tikka |
| 6,987,433 | B2 | 1/2006 | Larson |
| 6,989,723 | B2 | 1/2006 | Komuro et al. |
| 7,019,605 | B2 | 3/2006 | Larson, III |
| 7,091,649 | B2 | 8/2006 | Larson, III et al. |
| 2002/0190814 | A1 | 12/2002 | Yamada et al. |
| 2003/0030514 | A1 * | 2/2003 | Suma et al. .................. 333/206 |
| 2003/0128081 | A1 | 7/2003 | Ella et al. |
| 2003/0227338 | A1 * | 12/2003 | Kawakubo et al. ...... 331/107 A |
| 2004/0150293 | A1 | 8/2004 | Unterberger |
| 2004/0195937 | A1 | 10/2004 | Matsubara et al. |
| 2004/0196121 | A1 * | 10/2004 | Toncich ..................... 333/207 |
| 2004/0227578 | A1 * | 11/2004 | Hamalainen ............ 331/107 A |
| 2005/0057117 | A1 | 3/2005 | Nakatsuka et al. |
| 2005/0068124 | A1 | 3/2005 | Stoemmer |
| 2005/0093654 | A1 | 5/2005 | Larson, III et al. |
| 2005/0093655 | A1 | 5/2005 | Larson, III et al. |
| 2005/0093658 | A1 | 5/2005 | Larson et al. |
| 2005/0093659 | A1 | 5/2005 | Larson, III et al. |
| 2005/0104690 | A1 | 5/2005 | Larson et al. |
| 2005/0128030 | A1 | 6/2005 | Larson et al. |
| 2005/0193507 | A1 | 9/2005 | Ludwiczak |
| 2006/0003714 | A1 * | 1/2006 | Meck .......................... 455/121 |
| 2006/0164183 | A1 | 7/2006 | Tikka et al. |

FOREIGN PATENT DOCUMENTS

| | | |
|---|---|---|
| EP | 0 880 227 | 11/1998 |
| EP | 1 047 189 | 4/1999 |
| EP | 1 100 196 | 5/2001 |
| EP | 1 542 362 | 6/2003 |
| EP | 1 557 945 | 10/2003 |
| EP | 1 517 444 | 8/2004 |
| JP | 2002-217676 | 8/2002 |
| WO | WO 98/16957 | 4/1998 |
| WO | WO 03/030358 | 4/2003 |
| WO | WO 03/050950 | 6/2003 |
| WO | WO 03/005880 | 7/2003 |
| WO | WO 03/058809 | 7/2003 |
| WO | WO 2004/034579 | 4/2004 |

OTHER PUBLICATIONS

Jung, Jun-Phil, "Experimental and Theoretical INvestigation on the Relationship between AIN Properties and AIN-based FBAR Characteristics", IEEE Internations Frequency Control Symposium, May 4, 2003, pp. 779-784.

Krishnaswamy, S.V., et al., "Film Bulk Acoustic Wave Resonatior Technology", Ultrasonic Symposium, Proceedings 1990, pp. 529-535 vol. 1, Dec. 1990.

Lobl, H.P., et al., "Piezoelectric Material for BAW Resonators and Filters", IEEE Ultrasonics Symposium Oct. 5, 2003, pp. 807-811.

Martin, et al., "Development of Low-Dielectric Constant Polymer for Fabrication of Integrated Circuit Interconnect", 12 Advanced Materials, pp. 1769-1778, vol. 23. Dec. 1, 2000.

Reinhardt, Alexandre et al., "Design of Coupled Resonator Filters Using Admittance and Scattering Matrices", 2003 IEEE Ultrasonics Symposium Oct. 5-8, 2003, vol. 2, pp. 1428-1431.

Yang, C.-M., Highly C-Axis-Oriented AIN Film Using MOCVD for 5GHz-Band FBAR Filter, IEEE Ultrasonics Symposium, Oct. 5, 2003, 99. 170-173.

Examination Report corresponding to application No. GB0605775.6 dated Aug. 30, 2006.

Examination Report corresponding to application No. GB0605770.7 dated Aug. 25, 2006.

Examination Report from corresponding application No. GB0605779.8 dated Aug. 23, 2006.

Examination Report from corresponding application No. GB0605971.1 dated Aug. 24, 2006.

K.M. Lakin et al., "High Performance Stacked Crystal Filter For GPS and Wide Banwidth Applications", 2001 IEEE Ultrasonics Symposium; vol. 1, pp. 833-838, Oct. 7-10, 2001.

* cited by examiner

METHOD AND APPARATUS FOR SELECTIVELY BLOCKING RADIO FREQUENCY (RF) SIGNALS IN A RADIO FREQUENCY (RF) SWITCHING CIRCUIT

BACKGROUND OF THE INVENTION

Radio frequency (RF) switching circuits are used in many different areas of technology for many different purposes. One known use of an RF switching circuit is to switch the range of frequencies that is blocked by the switching circuit from a first range of frequencies to a second range of frequencies, and vice versa. Known RF switching solutions that are used for this purpose include Positive-Intrinsic-Negative (PIN) diodes and gallium arsenide (GaAs) field effect transistors (FETs). Each of these solutions has advantages and disadvantages.

PIN diodes have very good linearity, but consume a relatively large amount of current. In addition, PIN diodes are not easily made using silicon-based integrated circuit (IC) processes. Another drawback is that RF switching circuits that use PIN diodes normally require RF blocking inductors and biasing resistors in order to perform switching with low power loss.

RF switches that use GaAs FETs consume a relatively small amount of current, but have poor linearity unless they are made very large. If they are made very large, they require a large amount of area on the IC. In addition, GaAs FETs generally are not compatible with silicon-based IC processes.

A need exists for an RF switching solution that has good linearity, consumes a relatively small amount of current, is compatible with silicon-based IC processes, and can be implemented in a relatively small area on an IC.

SUMMARY OF THE INVENTION

The invention is directed to a method and apparatus for use in an RF switching circuit for selectively blocking RF signals. When the apparatus is in a first switching state, a film bulk acoustic resonator (FBAR) device of the apparatus causes an RF signal of a first frequency to be blocked from passing from the input of the circuit to the output of the circuit and allows a second RF signal of a second frequency to pass from the input to the output. When the apparatus is in the second switching state, the capacitance of a capacitive element of the circuit adds to the capacitance of the FBAR device causing the RF signal of the second frequency to be blocked from passing from the input to the output and allowing the first RF signal of the first frequency to pass from the input to the output.

The method of the invention includes switching a capacitive element into and out of a parallel electrical connection with the FBAR device. When the capacitive element is switched out of the parallel electrical connection, the FBAR device causes an RF signal of a first frequency to be blocked from passing from the input to the output and allows a second RF signal of a second frequency to pass from the input to the output. When the capacitive element is switched into a parallel electrical connection with the FBAR device, the capacitance of the capacitive element adds to the capacitance of the FBAR device causing the second RF signal of the second frequency to be blocked from passing from the input to the output and allowing the first RF signal of the first frequency to pass from the input to the output.

The capacitive element may be a switching element that has some capacitance and that performs the switching function, or it may be a separate capacitive element that performs no switching function, such as, for example, a capacitor.

These and other features and advantages of the invention will become apparent from the following description, drawings and claims.

DETAILED DESCRIPTION OF THE INVENTION

The present invention provides an RF switching circuit that incorporates a film bulk acoustic resonator (FBAR) device and a capacitive elements that are used to vary the capacitance of the FBAR device to change the frequency range that is blocked by the FBAR device. The capacitive element may be a switching element that has some capacitance and that performs the switching function (e.g., a varactor diode), or it may be a separate capacitive element (e.g., a capacitor) that performs no switching function, but that is used in conjunction with a switching element (e.g., a transistor, a relay device, etc.) that performs the switching function.

When the RF switching circuit is in a first switching state, a first set of RF signals in a first frequency range is blocked by the RF switching circuit while RF signals at other frequencies are passed by the RF switching circuit. When the RF switching circuit is in a second switching state, a second set of RF signals in a second frequency range is blocked by the RF switching circuit while RF signals at other frequencies are passed by the RF switching circuit.

The RF switching circuit of the invention is suitable for use in a variety of devices including, for example, duplexers, frequency shifters, frequency modulators, RF identification (ID) devices, etc. However, the RF switching circuit of the invention is not limited to any particular use. Prior to describing the RF switching circuit of the invention, a brief description of FBAR technology will be provided.

As is known in the art of FBAR technology, an FBAR device can be created by using a silicon-based IC process to build a Metal-Aluminum Nitride (AlN)-Metal "sandwich". When an alternating electrical potential is applied across the Metal-AlN-Metal sandwich, the entire AlN layer expands and contracts, i.e., the device resonates. This resonance is in the bulk (i.e., body) of the material, as opposed to being confined to the surface of the material, as is the case with Surface Acoustic Wave (SAW) devices. The resonance is acoustic. Because sound waves traveling at several hundred meters per second have much shorter wavelengths than electrical signals moving at the speed of light, the dimensions for an acoustic resonator at a given frequency are several orders of magnitude smaller than for a coaxial-based resonator. This size feature enables the acoustic resonator to fit easily on an IC chip. Thus, because an FBAR device is compatible with silicon-based IC processes, it is well suited for implementation in an IC.

Having provided a brief description of FBAR technology, an example of the manner in which FBAR technology may be implemented in an RF switching circuit in accordance with the invention will now be provided.

Figure 1:
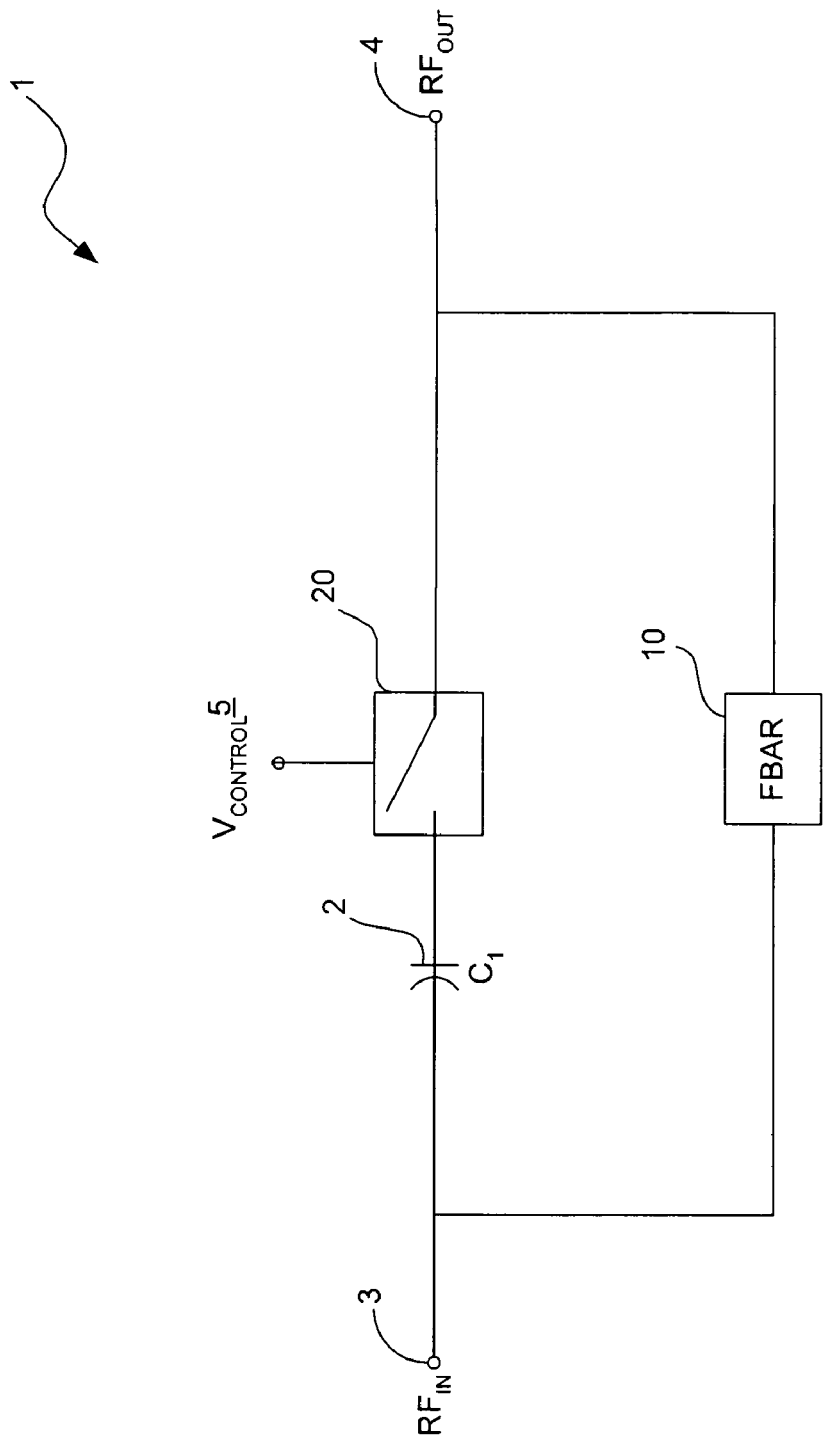
FIG. 1 illustrates a block diagram of an RF switching circuit in accordance with a first exemplary embodiment of the invention.

The RF switching circuit of the invention has at least one capacitive element (e.g., a capacitor, a diode, etc.), a switch and an FBAR device. Depending on the state of the switch, the capacitive element is either switched in or switched out of a parallel electrical connection with the FBAR device, which alters the range of RF frequencies that are blocked by the RF switching circuit. FIG. 1 illustrates a block diagram of an RF switching circuit 1 in accordance with a first exemplary embodiment of the invention.

In accordance with this embodiment, a single FBAR device 10 is used in combination with a switch 20 that controls whether a capacitor, $C_1$, 2 is switched into or out of a parallel electrical connection with the FBAR device 10. When the switch 20 is open, the FBAR device 10 will operate in its normal manner and will block RF signals that are in a first frequency range while passing RF signals that have frequencies that are outside of the first frequency range. When the switch 20 is closed by applying a control voltage signal, $V_{CONTROL}$, 5 to the switch 20, the capacitor 2 is connected in parallel with the FBAR device 10. In this switching state, the capacitance of the capacitor 2 adds to the capacitance of the FBAR device 10. This increase in the capacitance across the FBAR device 10 decreases the RF frequency range that is blocked by the RF switching circuit 1. Thus, the range of frequencies of the RF signals that are blocked from passing from input terminal, $RF_{IN}$, 3 to the output terminal, $RF_{OUT}$, 4 of the RF switching circuit 1 will be higher when the switch 20 is opened than when the switch 20 is closed.

Figure 2:
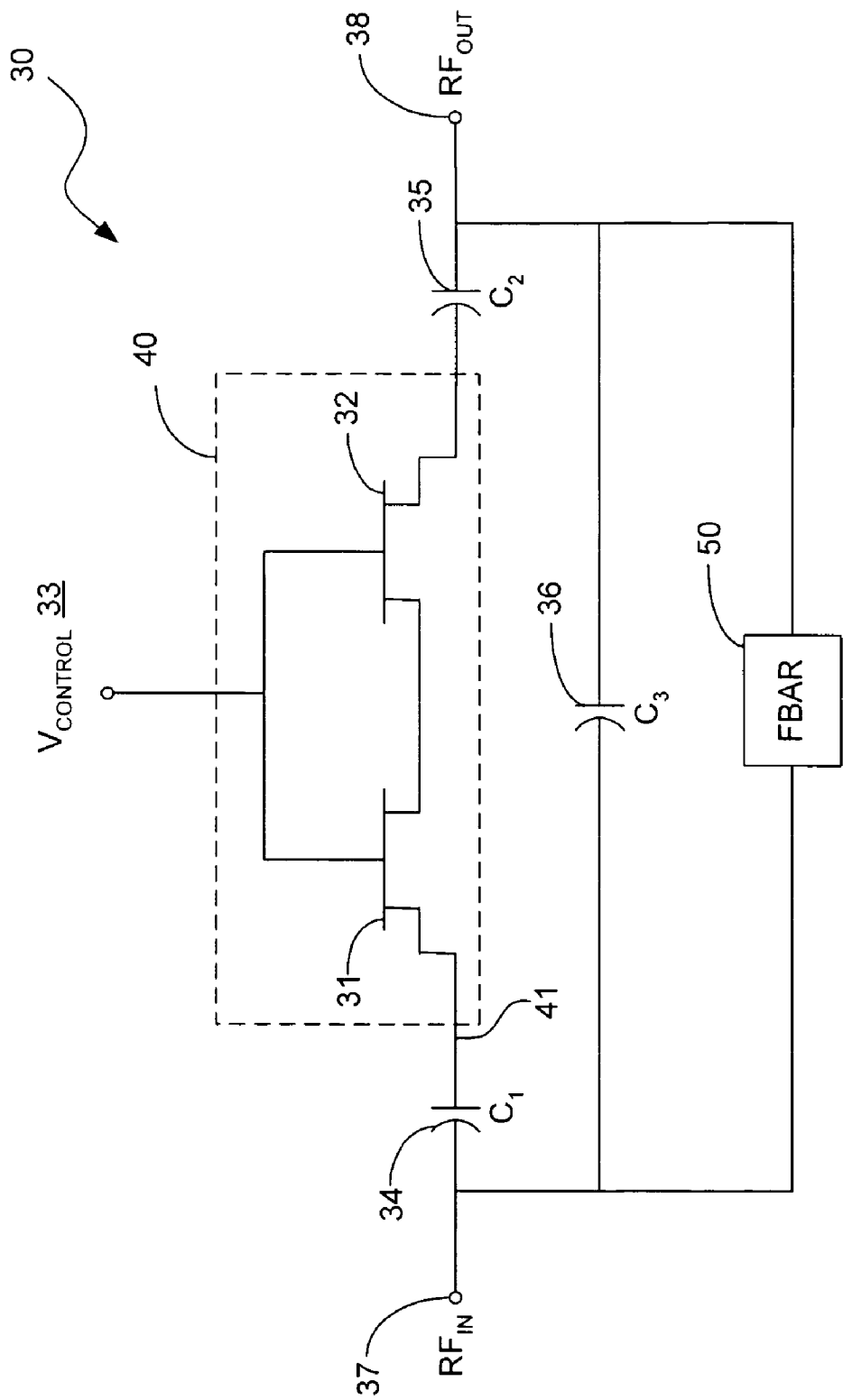
FIG. 2 illustrates a block diagram of the RF switching circuit of the invention in accordance with another exemplary embodiment.

FIG. 2 illustrates a block diagram of the RF switching circuit 30 of the invention in accordance with another exemplary embodiment. In accordance with this embodiment, a switch 40 that includes two FETs 31 and 32 is used to switch two capacitors 34 and 35 into and out of a parallel electrical connection with FBAR device 50. The FETs 31 and 32 of the switch 40 are "ganged" together such that they are switched on together and off together. The switching of the FETs 31 and 32 is controlled by a control voltage signal, $V_{CONTROL}$, 33 applied to the gates of the FETs 31 and 32. For example, when the value of the $V_{CONTROL}$ signal 33 is set to 3.0 volts, the FETs 31 and 32 are both turned on, which causes capacitors 34 and 35 to be electrically connected in parallel with the FBAR device 50. When the value of the $V_{CONTROL}$ signal 33 is set equal to 0 volts, the FETs 31 and 32 are turned off, which causes the path 41 containing capacitors 34 and 35 to be opened.

When the path 41 containing capacitors 34 and 35 is opened by turning FETs 31 and 32 off, the FBAR device 50 operates in the normal manner, and the RF switching circuit 30 blocks signals having frequencies in a first frequency range while passing signals outside of the first frequency range. When the path 41 containing capacitors 34 and 35 is closed by turning FETs 31 and 32 on, the capacitances of the capacitors 34 and 35 add to the capacitance of the FBAR device 50, which causes the range of frequencies that is blocked by the RF switching circuit 30 to be decreased relative to the range of frequencies that is blocked when the path 34 is opened.

One of the advantages of ganging two FETs 31 and 32 together in the switch 40 instead of using a single FET is that ganging the FETs together compensates for any asymmetries in the FETs that exist as a result of process variations and other factors that exist during manufacturing of the IC. There is a physical distance between the gate and drain and between the gate and source of each FET. In some cases, the gate-to-drain and gate-to-source distances are the same for each of the FETs. In other cases, the distances are slightly different, which causes the circuit to be differently matched at the input terminal 37 and output terminal 38. Using multiple FETs and tying the sources of the FETs together in the manner shown in FIG. 2 ensures that potential asymmetries in the FETs will not result in such mismatches. In addition, because no direct current (DC) flows in the FETs in either state, no additional power is consumed by the switching circuit.

The reason for using two capacitors in path 41 is to ensure that there is sufficient capacitance to add to the capacitance of the FBAR device 50 to obtain the parallel capacitance needed to obtain the desired blocking frequency range shift. A third capacitor 36, which is optional, may be added if desired if the capacitance provided by capacitors 34 and 35 is not sufficient to obtain the desired blocking frequency range shift.

Figure 3:
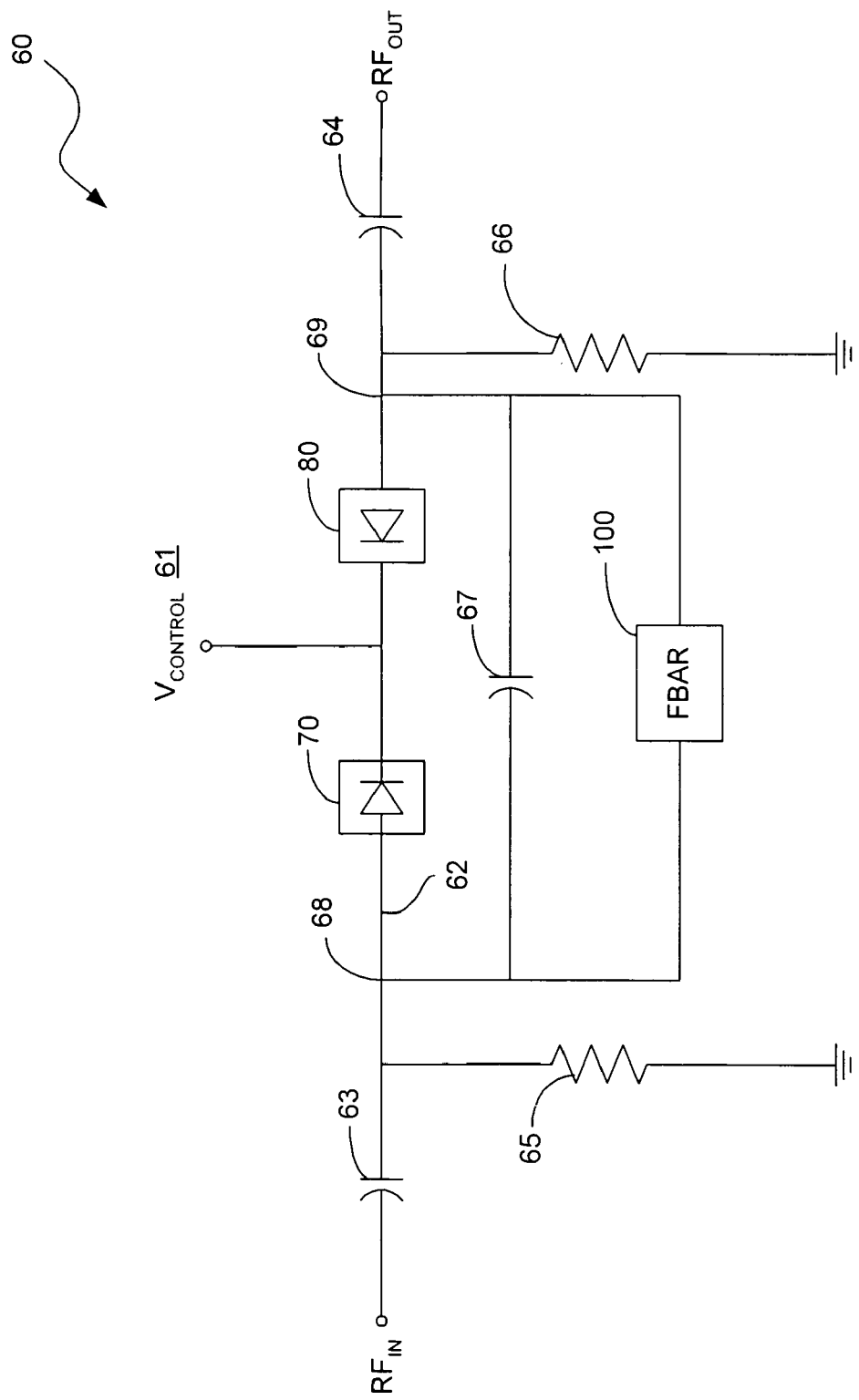
FIG. 3 illustrates a block diagram of the RF switching circuit of the invention in accordance with another exemplary embodiment.

FIG. 3 illustrates a block diagram of the RF switching circuit 60 of the invention in accordance with another exemplary embodiment. In accordance with this embodiment, two varactor diodes 70 and 80 are used as variable capacitors to change the frequency range that is blocked by the FBAR device 100. Each of the varactor diodes 70 and 80 has a capacitance that varies inversely with the reverse bias voltage applied to it. The varactor diodes 70 and 80 are reverse biased when the control voltage, $V_{CONTROL}$, 61 is 3.0 volts. In this switching state, almost no current flows through the path 62 containing the diodes 70 and 80. When $V_{CONTROL}$ 61 is 0 volts, the cathodes and anodes of each of the diodes 70 and 80 are at the same voltage potential, and so, again, almost no current flows through the path 62. Therefore, in both switching states, almost no current flows through path 62, although the capacitances produced by the varactor diodes 70 and 80 vary greatly from one switching state to the other. Consequently, the RF circuit 60 performs switching with very low power dissipation.

When $V_{CONTROL}$ is 3.0 volts and the diodes 70 and 80 are reverse biased, the capacitances of the varactors 20 and 30 add to the capacitance of the FBAR device 100, which increases the center frequency of the range of frequencies that is blocked by the FBAR device 100. When $V_{CONTROL}$ is 0 volts, the FBAR device 100 operates in its normal manner and the center frequency of the range of frequencies that is blocked by the FBAR device 100 is lower than the center frequency of the range of frequencies that is blocked by the FBAR device 100 when $V_{CONTROL}$ is 3.0 volts and the diodes 70 and 80 are reverse biased.

The capacitor 67 is optional and is used when needed to increase the amount of capacitance that is added to the capacitance of the FBAR device 100 in order to shift the frequency range that is blocked by the FBAR device 100 by the desired amount. The capacitors 64 and 65 isolate the $RF_{IN}$ and $RF_{OUT}$ ports from external DC voltages. The resistors 65 and 66 maintain the nodes 68 and 69 at ground potential, which prevents the nodes from floating to an indeterminate DC voltage.

Figure 4:
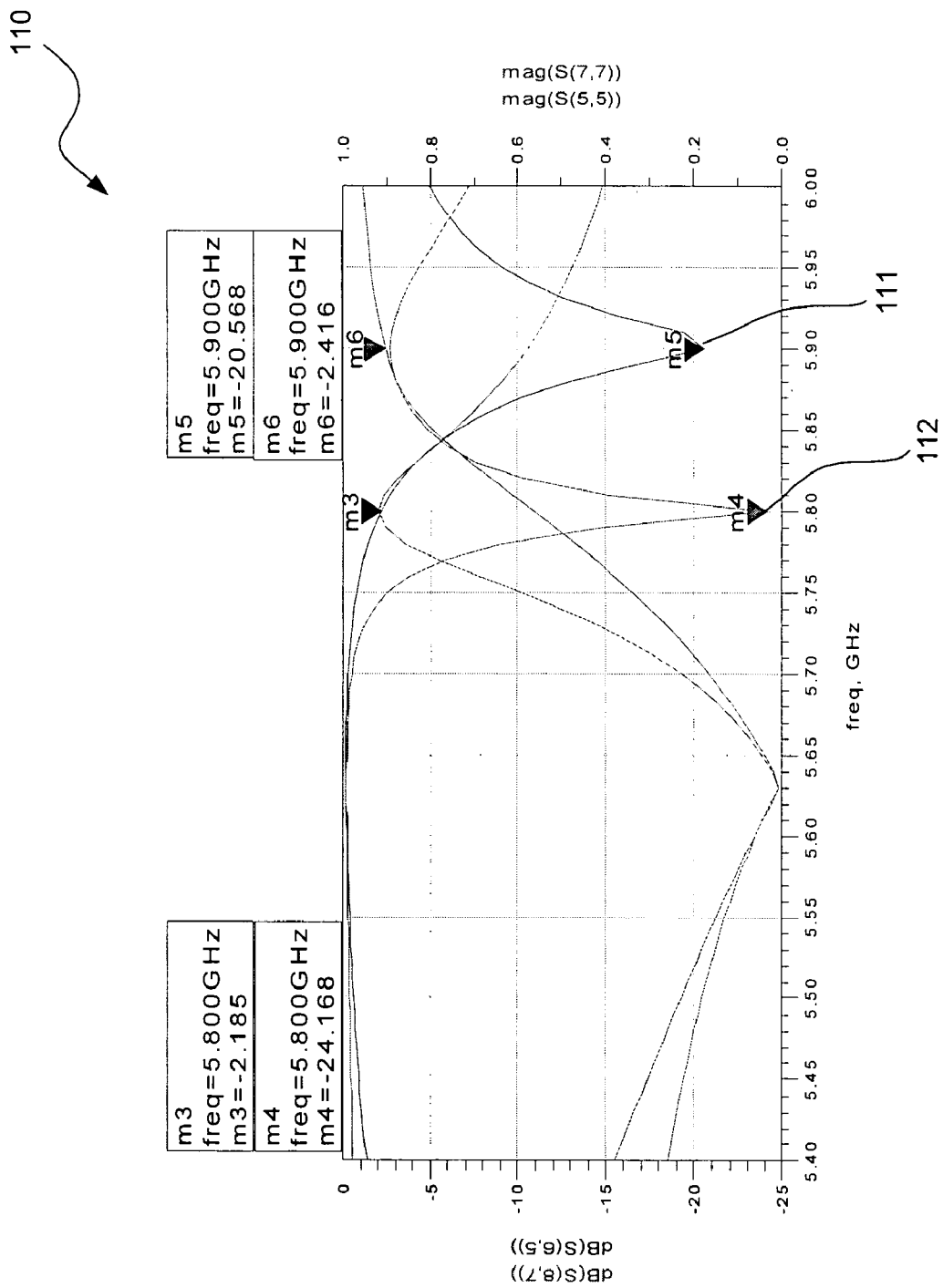
FIG. 4 illustrates plot of frequency versus gain for an RF switching circuit having the configuration of the RF circuit shown in FIG. 3.

FIG. 4 illustrates plot 110 of frequency versus gain for an RF switching circuit having the configuration of the RF circuit 60 shown in FIG. 3. The horizontal axis shows frequency in Gigahertz (GHz). The vertical axis shows gain in decibels (dB). When $V_{CONTROL}$ is 3.0 volts, the center frequency of the frequencies that are blocked by the FBAR device 100 is 5.90 GHz, which corresponds to point 111 in plot 110. When $V_{CONTROL}$ is 0 volts, the center frequency of the frequencies that are blocked by the FBAR device 100 is 5.80 GHz, which corresponds to point 112 in plot 110. Thus, when one of the center frequencies is blocked the other is transmitted with minimum attenuation, and vice versa. As demonstrated by the plot 110, the invention takes advantage of the inherently high rejection capability of the FBAR device 100 to enable switching of RF signals that are very close to one another in frequency.

It should be noted that the invention has been described with respect to particular exemplary and preferred embodiments, and that the invention is not limited to the embodiments described herein. Modifications may be made to the embodiments described herein without deviating from the scope of the invention. For example, a variety of different switching configurations other than those shown in FIGS. 1-3 can be used to control the addition of capacitance to the capacitance of the FBAR device in order to change the blocked frequency range. For example, rather than using FETs or varactor diodes as the switches, a relay switch may be used to provide switching. The relay switch may be external to the IC that contains the FBAR device. All such modifications are within the scope of the invention.

What is claimed is:

1. An apparatus for selectively blocking radio frequency (RF) signals, the apparatus comprising a first switching state and a second switching state, the apparatus further comprising:
   an input;
   an output;
   a film bulk acoustic resonator (FBAR) device located between the input and the output, the FBAR device having a capacitance, wherein when the apparatus is in the first switching state, the FBAR device causes a first RF signal of a first frequency to be blocked from passing from the input to the output and allows a second RF signal of a second frequency to pass from the input to the output; and
   a capacitive element having a capacitance, wherein when the apparatus is in the second switching state, the capacitance of the capacitive element adds to the capacitance of the FBAR device causing the second RF signal of the second frequency to be blocked from passing from the input to the output and allowing the first RF signal of the first frequency to pass from the input to the output.

2. The apparatus of claim 1, wherein the capacitive element includes at least one capacitor, and wherein the apparatus further comprises: a switching configuration that controls the switching of the apparatus from the first switching state to the second switching state, and from the second switching state to the first switching state, wherein when the switching configuration is such that the apparatus is in the second switching state, said at least one capacitor is electrically connected in parallel with the FBAR device such that the capacitance of said at least one capacitor adds to the capacitance of the FBAR device.

3. The apparatus of claim 2, wherein the capacitive element includes at least two capacitors, wherein when the switching configuration is such that the apparatus is in the second switching state, said at least two capacitors are electrically connected in parallel with the FBAR device and the capacitance of said at least two capacitors adds to the capacitance of the FBAR device.

4. The apparatus of claim 2, wherein the switching configuration includes at least one field effect transistor (FET) electrically connected in series with said at least one capacitor, wherein when said at least one FET is turned off, the apparatus is in the first switching state, and wherein when said at least one FET is turned on, the apparatus is in the second switching state and said at least one capacitor is electrically connected in parallel with the FBAR device.

5. The apparatus of claim 4, wherein the switching configuration includes at least two field effect transistors (FET) electrically connected in series with said at least one capacitor, the two FETs being connected to be turned on together and turned off together, wherein when the FETs are turned off, the apparatus is in the first switching state, and wherein when the FETs are turned on, the apparatus is in the second switching state and said at least one capacitor is electrically connected in parallel with the FBAR device.

6. The apparatus of claim 1, wherein the capacitive element includes at least one varactor diode, wherein when the apparatus is in the first switching state, said at least one varactor diode is turned off and wherein when the apparatus is in the second switching state, said at least one varactor diode is turned on and the capacitance of the varactor diode adds to the capacitance of the FBAR device.

7. The apparatus of claim 6, wherein the capacitive element includes at least two varactor diodes, wherein when the apparatus is in the first switching state, said at least two varactor diodes are turned off and wherein when the apparatus is in the second switching state, said at least two varactor diodes are turned on and the capacitances of the varactor diodes add to the capacitance of the FBAR device.

8. A method for selectively blocking radio frequency (RF) signals from passing from an input of a circuit to an output of the circuit, the method comprising: switching a capacitive element out of a parallel electrical connection with a film bulk acoustic resonator (FBAR) device, the FBAR device having a capacitance, wherein when the capacitive element is switched out of the parallel electrical connection, the FBAR device causes a first RF signal of a first frequency to be blocked from passing from the input to the output and allows a second RF signal of a second frequency to pass from the input to the output; and switching a capacitive element into a parallel electrical connection with the FBAR device, wherein when the capacitive element is switched into the parallel electrical connection, the capacitance of the capacitive element adds to the capacitance of the FBAR device causing the second RF signal of the second frequency to be blocked from passing from the input to the output and allowing the first RF signal of the first frequency to pass from the input to the output.

9. The method of claim 8, wherein the capacitive element includes at least one capacitor.

10. The method of claim 9, wherein the capacitive element includes at least two capacitors.

11. The method of claim 9, wherein the switching is performed by turning off and on at least one field effect transistor (FET) electrically connected in series with said at least one capacitor, wherein when said at least one FET is turned on, said at least one capacitor is electrically connected in parallel with the FBAR device such that the capacitance of said at least one capacitor adds to the capacitance of the FBAR device.

12. The method of claim 11, wherein the switching is performed by turning off and on at least two field effect transistor (FET) electrically connected in series with said at least one capacitor, the two FETs being connected to be turned on together and turned off together, wherein when the FETs are turned on, said at least one capacitor is electrically connected in parallel with the FBAR device such that the capacitance of said at least one capacitor adds to the capacitance of the FBAR device.

13. The method of claim 8, wherein the capacitive element includes at least one varactor diode, and wherein the switching is performed by turning said at least one varactor diode off and on, wherein when said at least one varactor diode is turned on, the capacitance of said at least one varactor diode adds to the capacitance of the FBAR device.

* * * * *